United States Patent [19]
Bjornard et al.

[11] Patent Number: 5,651,723
[45] Date of Patent: Jul. 29, 1997

[54] METHOD AND APPARATUS FOR CLEANING SUBSTRATES IN PREPARATION FOR DEPOSITION OF THIN FILM COATINGS

[75] Inventors: Erik J. Bjornard; Eric W. Kurman, both of Northfield; David A. Shogren, Lakeville; Jeffrey J. Hoffman, Inver Grove Heights, all of Minn.

[73] Assignee: Viratec Thin Films, Inc., Faribault, Minn.

[21] Appl. No.: 227,156

[22] Filed: Apr. 13, 1994

[51] Int. Cl.$^6$ .................. B24B 1/00; B24C 1/06; B24C 3/12
[52] U.S. Cl. .................. 451/39; 451/81; 451/87; 451/89; 451/99
[58] Field of Search .................. 451/28, 36, 38, 451/40, 53, 54, 57, 75, 80, 81, 87, 88, 89, 99, 91, 39; 134/22.18

[56] References Cited

U.S. PATENT DOCUMENTS

| | | | |
|---|---|---|---|
| 4,562,791 | 1/1986 | Porter et al. | 451/87 |
| 4,631,250 | 12/1986 | Hayashi | 451/38 |
| 4,936,922 | 6/1990 | Cherry | 134/22.18 |
| 4,974,375 | 12/1990 | Tada et al. | 451/38 |
| 5,009,240 | 4/1991 | Levi . | |
| 5,025,597 | 6/1991 | Tada et al. . | |
| 5,071,289 | 12/1991 | Spivak . | |
| 5,074,083 | 12/1991 | Kanno et al. . | |
| 5,123,207 | 6/1992 | Gillis, Jr. et al. | 451/89 |
| 5,127,198 | 7/1992 | Nakayama et al. | 451/87 |
| 5,182,882 | 2/1993 | Brodene et al. | 451/87 |
| 5,196,034 | 3/1993 | Ono et al. . | |
| 5,203,794 | 4/1993 | Stratford et al. . | |
| 5,249,426 | 10/1993 | Spivak et al. . | |
| 5,315,793 | 5/1994 | Peterson et al. | 451/89 |
| 5,364,472 | 11/1994 | Heyns et al. . | |
| 5,365,699 | 11/1994 | Armstrong et al. . | |
| 5,367,838 | 11/1994 | Visaisouk et al. . | |
| 5,431,740 | 7/1995 | Swain | 451/7 |

*Primary Examiner*—Timothy V. Eley
*Attorney, Agent, or Firm*—Dorsey & Whitney LLP

[57] ABSTRACT

A method and apparatus for cleaning a substrate in preparation for thin film coating. The invention involves cleaning the substrate in a cleaning chamber under controlled conditions by a blast of carbon dioxide pellets suspended in and transported by a compressed gas medium.

22 Claims, 4 Drawing Sheets

METHOD AND APPARATUS FOR CLEANING SUBSTRATES IN PREPARATION FOR DEPOSITION OF THIN FILM COATINGS

BACKGROUND OF THE INVENTION

1. Field of the Invention

The present invention relates generally to a method and apparatus for cleaning substrates in preparation for the deposition of thin film coatings, and more particularly to a method and apparatus for cleaning cathode ray tube (CRT) screens and other substrates such as those used in the flat panel display industry, all in preparation for the application of thin film coatings via physical or chemical vapor deposition processes.

2. Description of the Prior Art

A variety of techniques currently exist for depositing a thin film coating onto a substrate. Such techniques include electron beam deposition, chemical vapor deposition and sputtering, among others. Substrates to which thin film coatings are commonly applied include glass and to a lesser extent plastic, although the thin film coating of plastic, metal and ceramic substrates is also possible. Specific examples include glass and plastic substrates used in the flat panel display industry and CRT screens and panels used in the manufacture of computer monitors and television sets. Thin film coatings are applied to the above and other substrates for the purpose of providing such substrates with durability or with functional, electrical, optical, corrosion resistant or other properties.

Substrate cleaning and preparation is a necessary adjunct of physical and chemical vapor deposition processes for the production of thin film coatings. Such cleaning is necessary to remove contaminants from the surface of the substrate to be coated so that a stable coating can be applied. The existing art for substrate cleaning prior to thin film deposition commonly involves use of a liquid or combination liquid and vapor and generally takes one of two paths: aqueous and solvent. Economic, environmental and safety considerations usually dictate an aqueous cleanser as the cleaning agent of choice, especially for large scale industrial applications. Cleaning techniques using aqueous cleansers can include immersion, rinsing, mechanical scrubbing, application of acoustic energy, among others. In cases where a high level of cleanliness is required, the last stage can include a rinse with deionized water which can be relatively expensive.

Although aqueous cleaning of substrates is acceptable for many applications, it has several limitations. First, it is difficult to keep the final rinse water clean and free of all residue. This is a particular concern with substrates used in flat panel displays where micro deposits of residue on the substrate can cause nucleation defects in the coating. This in turn can lead to breaks in the patterns etched into the substrate. Second, it is difficult to dry the substrate in an efficient manner. This presents a problem because water vapor is incompatible with most vacuum coating processes. Total removal of water generally involves long outgassing periods before the coating process begins. Third, substrates which have complex shapes or assemblies are likely to trap water during the cleaning process, thus making it particularly difficult to remove all water from these areas. A specific example is a CRT which commonly includes a metal rim band surrounding the periphery of the face plate. The rim band is commonly applied over a band of fiber glass, rubber, plastic or paper which is positioned between the rim band and the glass envelope of the CRT. This structure provides numerous recesses, gaps and materials which may trap the aqueous cleaning medium. Removal of such medium from these spaces ordinarily requires prolonged exposure to a dry atmosphere, or heating or exposure to reduced pressure to volatilize the medium. The time and energy required to accomplish such removal often render the process uneconomical.

Solvent cleaning has also been used in some applications to prepare substrates for thin film coating. However, because solvents are also liquids, solvent cleaning involves many of the same limitations as aqueous cleaning. For example, it is difficult to keep the final solvent rinse totally free of residue and solvent can be still be trapped in areas where removal is difficult. Although solvents are generally more volatile than aqueous cleansers, and thus evaporate more quickly, it is this property that leads to environmental and safety concern since many of the solvents are petroleum based and thus emit volatile organic compounds (VOCs). Further, many of the nonaqueous cleansing solvents are toxic, flammable and expensive.

Accordingly, there is a need in the art for a method and apparatus for cleaning substrates in preparation for thin film coating in which such method and apparatus is economically feasible, is environmentally sound, is dry, facilitates the efficient removal of all residue and acceptably cleans the substrate.

SUMMARY OF THE INVENTION

In contrast to the prior art, the present invention relates to a method and apparatus for cleaning substrates in preparation for thin film deposition which is inexpensive and environmentally sound, which effectively cleans the substrate and which is dry and leaves no residue behind. More specifically, the present invention relates to a method and apparatus for cleaning substrates in preparation for thin film, physical and chemical vapor deposition which involves blasting the substrate with carbon dioxide pellets suspended in and transported by a compressed gas medium.

In the preferred method and apparatus of the present invention, CRT screens or other substrates useful with CRTs or in flat panel displays are exposed to a continuous blast of solid carbon dioxide particles. These particles dislodge dirt, grease and other contaminants from the substrate surface and carry the same away from the substrate via gravity and air flow. Because the cleaning method and apparatus of the present invention do not involve the use of aqueous or solvent mediums, the limitations described above with respect to liquid cleaners do not exist.

The apparatus of the preferred embodiment includes a cleaning chamber provided with pressure conditions and air flow means to maintain such chamber at substantially clean room conditions. The apparatus also includes means for generating the carbon dioxide blast pellets and propelling the same into engagement with the substrate under conditions sufficient for cleaning. The apparatus also preferably includes an entry chamber positioned adjacent to the cleaning chamber entry for holding a substrate prior to cleaning and an exit chamber positioned adjacent to the cleaning chamber exit for holding a substrate subsequent to cleaning.

The method aspect of the present invention includes introducing a substrate to be coated into a cleaning chamber, providing pressure conditions within, and air flow through, such chamber to provide controlled clean room conditions and cleaning the substrate while in the cleaning chamber by blasts of carbon dioxide pellets suspended in and transported by a compressed gas medium. The method also preferably includes introducing controlled clean air at one end of the cleaning chamber and providing exhaust means at one or more locations throughout the chamber for the purpose of providing air flow through the chamber and removing the vaporized carbon dioxide and contaminate particles.

The preferred method further includes introducing the substrate to be coated into an entry chamber prior to entry into the cleaning chamber and moving the cleaned substrate into an exit chamber following the cleaning process.

Accordingly, an object of the present invention is to provide an improved method and apparatus for cleaning substrates in preparation for thin film deposition.

Another object of the present invention is to provide a method and apparatus for cleaning a substrate in preparation for physical or chemical vapor deposition in which the cleaning is environmentally sound, is inexpensive, is safe and does not involve a liquid cleaning agent.

A further object of the present invention is to provide a method and apparatus for cleaning CRT screens and substrates useful in conjunction with CRTs and with flat panel displays in preparation for physical or chemical vapor deposition of a thin film coating.

These and other objects of the present invention will become apparent with reference to the drawings, the description of the preferred embodiment and the appended claims.

DESCRIPTION OF THE PREFERRED EMBODIMENT

Figure 1:
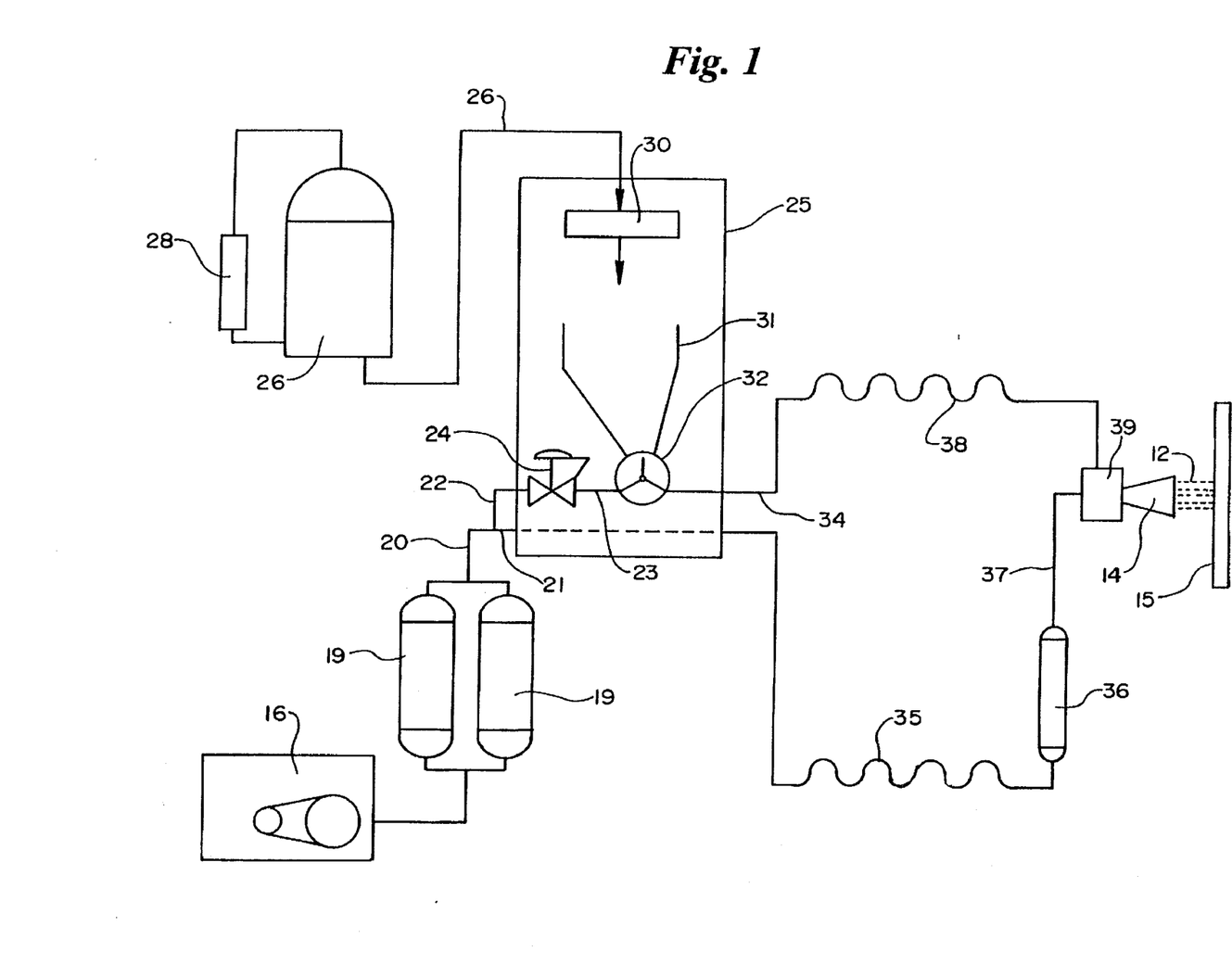
FIG. 1 is a schematic illustration of carbon dioxide pellet producing equipment useful in the method and apparatus of the present invention.
Figure 2:
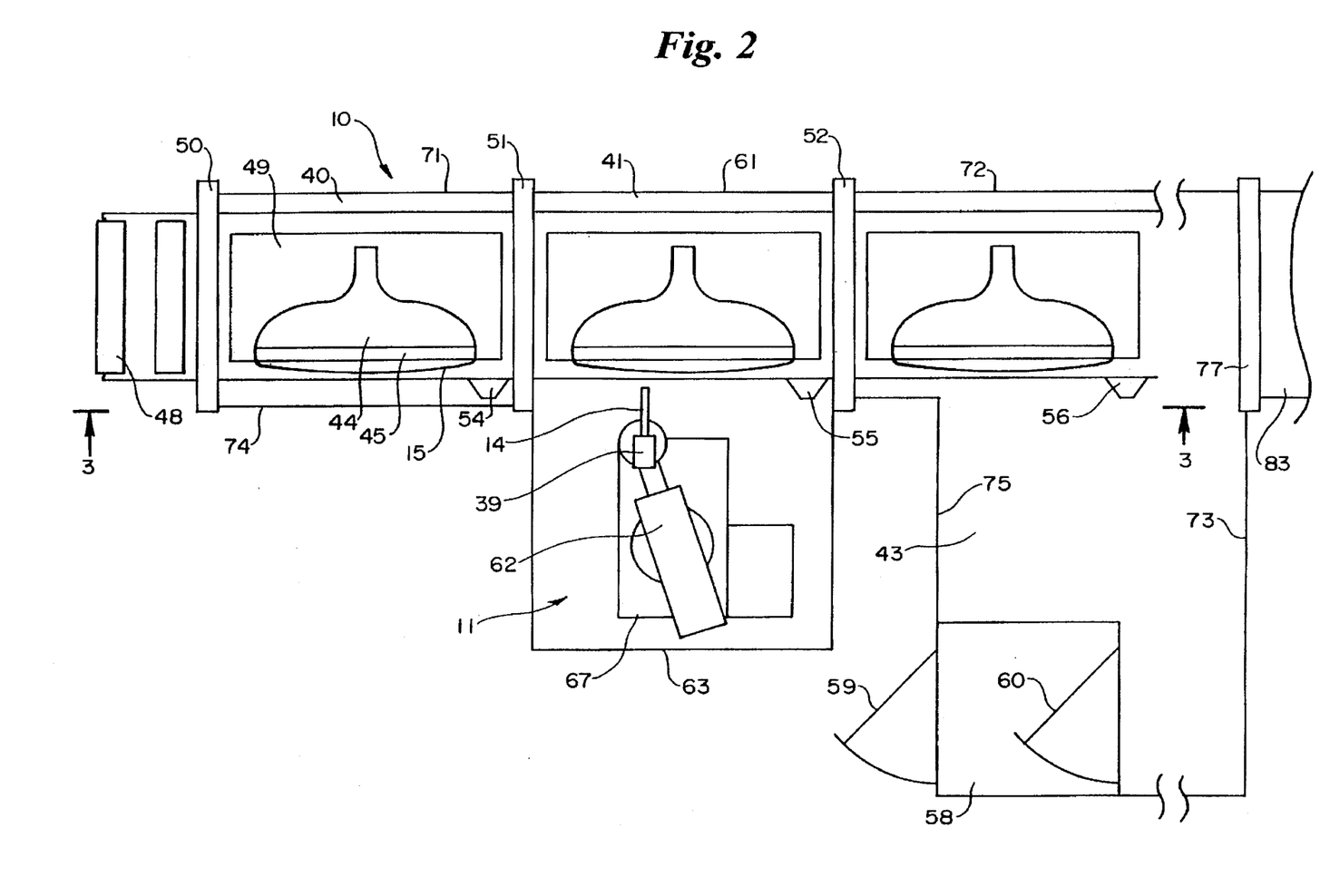
FIG. 2 is a plan view of the apparatus of the present invention showing movement of CRTs through the cleaning apparatus.

Reference is initially made to FIG. 2 for the purpose of identifying the major components of the apparatus of the present invention. In general, the apparatus includes a cleaning line designated by the general reference character 10, a robot assembly 11 for controlling movement of the carbon dioxide dispensing nozzle 14 and a mechanism for generating solid carbon dioxide particles. The preferred mechanism for generating the carbon dioxide particles is shown in FIG. 1.

FIG. 1 represents a schematic illustration of equipment known in the art for generating solid carbon dioxide particles 12 and providing such particles to a dispensing nozzle 14. Such equipment also includes means for propelling the carbon dioxide pellets 12 toward the substrate surface 15 for cleaning the same. The equipment illustrated in FIG. 1 is available in the art and is identified as a Model 250 Cleanblast Pelletizer from Alpheus Cleaning Technologies of Rancho Cucamonga, California.

The equipment of FIG. 1 includes a compressor 16 which supplies compressed air to a pair of desiccant dryers 19, 19 via the compressed air line 18. The dryers 19, 19 reduce the dew point of the compressed air to −40° C. or less. The compressed air which is in the range of about 40 to 200 psig then flows through the air line 20 where it is split into a blast air stream 21 and a carbon dioxide pellet transport air stream 22. The blast air stream 21 flows through a pelletizing apparatus 25 at which point it is connected to the blast air transport hose 35.

The carbon dioxide pellet transport air is provided to a pressure regulator 24 which reduces the pressure from the line 22 to the line 23 to a relatively low value in the range of about 40 psig. The pellet transport air at this reduced pressure exits from the regulator 24 through the line 23.

To produce the carbon dioxide pellets, liquid carbon dioxide is supplied from a storage tank 26 through a supply line 29 to a pelletizer 30 within the pelletizing chamber 25. Associated with the storage tank 26 is a vaporizer 28 which is provided to build pressure within the tank 26 to assure a supply of liquid carbon dioxide at a pressure of about 280 psig to the pelletizer 30. The pelletizer 30 functions to convert the liquid carbon dioxide into a mixture of carbon dioxide gas and subliminal carbon dioxide pellets which are deposited in the pellet hopper 31. The pellet hopper 31 includes a feeder mechanism 32 for introducing the carbon dioxide pellets into the compressed air line 23. Thus, the compressed air line 34 which leaves the feeder 32 is filled with carbon dioxide pellets with compressed air as a transport medium. These carbon dioxide pellets are transported through the pellet transport hose 38 to a blast gun 39. The compressed blast air is transported to the gun 39 from the line 21 along a blast air transport hose 35 and through a canister heater 36 which heats the blast air to a temperature ranging from about 100° and 250° C. The temperature to which the heater 36 heats the blast air is adjustable. The gun 39 is equipped with a discharge nozzle 14 which emits a stream of solid carbon dioxide pellets 12 and compressed air. This stream of carbon dioxide pellets 12 may be directed toward the substrate 15 to be cleaned in the manner described below.

Figure 3:
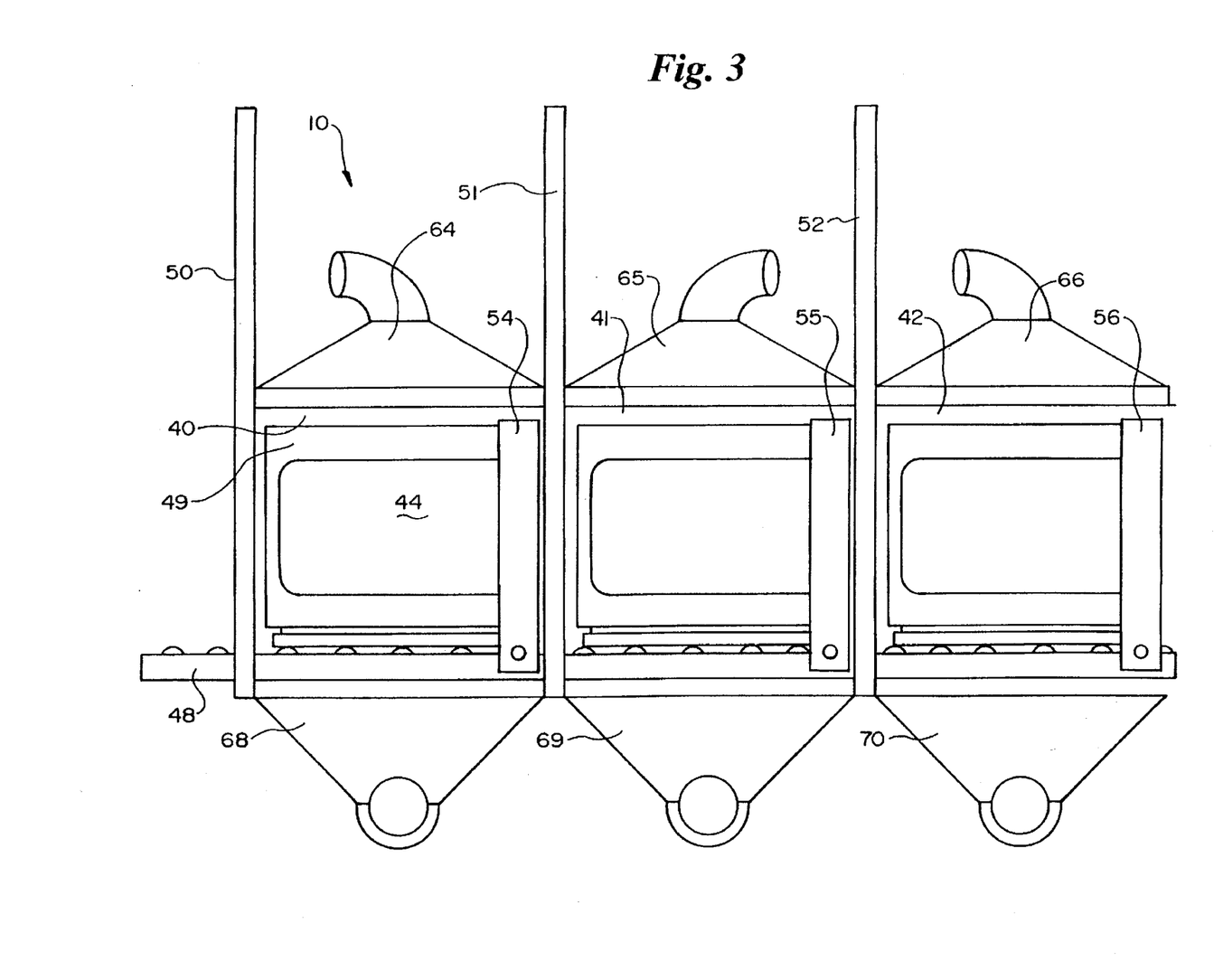
FIG. 3 is a front view as view along the viewing line 3—3 of FIG. 2 showing movement of CRTs through the cleaning apparatus.

Reference is next made to FIGS. 2 and 3 illustrating the cleaning line 10. In the preferred embodiment, the cleaning line 10 includes a centrally positioned cleaning chamber 41, an entry chamber 40 adjacent to an entry side of the chamber 41 and an exit chamber 42 adjacent to an exit side of the chamber 41. The cleaning line 10 also includes a conveyor 48 for conveying the substrates to be cleaned through the chambers 40, 41 and 42. In the preferred embodiment, the substrate 15 is the front face or screen of a CRT 44.

As shown in FIG. 2, the cleaning chamber is defined in part by a rear wall 61, a pair of spaced gate valves 51 and 52 and a forwardly positioned chamber portion 63 for housing the robot assembly 11 and the pellet dispensing means including the dispensing gun 39 and nozzle 14. As shown in FIG. 3, the top of the cleaning chamber 41 is defined by and provided with an inlet air plenum 65 for introducing clean air into the chamber 41 and an exhaust plenum 69 for exhausting air from the chamber 41. In the preferred embodiment, the chamber 41 is also provided with an ionizing vacuum pickup 55 which extends vertically through substantially the entire height of the chamber 41. The vacuum pickup 55 is located near the exit side of the chamber and is positioned in proximity to the substrate so that particulate matter is removed from the surface of the substrate during the cleaning process and particularly as the substrate 15 is transported past the pickup 55 during exit from the chamber 41. The pickup is also provided with an ionizing device to remove static electricity from the substrate 15.

The chamber 41 includes a substrate entry end defined by the gate valve 51 and a substrate exit end defined by the gate valve 52. During a cleaning cycle as described in greater detail below, the gate valve 51 is opened and a CRT 44 is introduced into the chamber 41. At the conclusion of the cleaning cycle, the gate valve 52 is opened and the CRT 44 is removed from the chamber 41. The preferred embodiment shows the substrate to be cleaned as the front face or screen 15 of a CRT 44. In the preferred embodiment, the CRT includes a rim or implosion band 45 and is mounted to a carrier 49 which is in turn designed for controlled movement along the conveyor 48. The chamber 41 is shown to be of a size to accommodate a single CRT 44, however, such size can be increased to hold multiple CRTs, if desired.

The entry chamber 40 is adjacent to the substrate entry end of the chamber 41 and is defined by the rear wall 71, the front wall 74 and the spaced gate valves 50 and 51. As illustrated in FIG. 3, the top of the chamber 40 also includes a clean air inlet plenum 64 for introducing clean air into the chamber 40 and an exhaust plenum 68 near the bottom for exhausting air from the chamber 40. Similar to the chamber 41, the chamber 40 is also provided with an ionizing vacuum pickup 54 extending vertically throughout substantially the entire height of the chamber 40. Depending upon the requirements of the system, the exhaust plenum 68 may be considered optional. In such event, the air within the chamber 40 would be exhausted entirely through the vacuum pickup 54 and leakage through the gate valve 50 and other openings within the system.

The exit chamber 42 is positioned adjacent to the substrate exit end of the chamber 41 and is defined by the rear wall 72, the exit end 73, the gate valve 52 and the forward wall 75. The wall 75 further defines a chamber portion 43 which facilitates entry by personnel for inspection or monitoring of the cleaned substrates. In the preferred embodiment, the chamber 43 is also provided with a manual entry chamber 58 which includes a pair of entry doors 59 and 60. The chamber 42 can be of a size to accommodate a plurality of cleaned substrates. In the preferred embodiment, the exit end 73 includes an exit gate valve or other closure means 77 which also defines the entry end to a thin film coating apparatus or line 83. As shown in FIG. 3, the chamber 42, like the chambers 40 and 41, includes a clean air inlet plenum 66 at the top of the chamber 42 for introducing clean air and an ionizing vacuum pickup 56 and bottom exhaust plenum 70 for exhausting air from the chamber 42. The bottom exhaust 70, however, may be considered optional.

During operation of the system, the air pressures within in each of the chambers 40, 41 and 42 are maintained at a positive pressure relative to atmospheric pressure with each individual chamber further being maintained at a pressure greater than the pressure in the chamber to its immediate left as viewed in FIGS. 2 and 3. For example, in the preferred embodiment, the air pressure in the chambers 40, 41 and 42 is maintained at a pressure between about 0.1 to 5.0 inches of water. Preferably the pressure in the entry chamber 40 is maintained at a pressure ranging from about 0.1 to 0.5 inches of water, the air pressure in the cleaning chamber 41 is maintained at a pressure ranging from about 0.5 to 1.0 inches of water, while the air pressure in the exit chamber 42 is maintained at a pressure ranging from about 1.0 to 3.0 inches of water. With the maintenance of the above pressures, the prevailing movement of air within the system is in a direction from the cleaned substrate exit chamber 42 to the cleaning chamber 41 and finally to the entry chamber 40. This ensures that to the extent contaminants exist in the air within the chambers, such contaminants and air flow will always be moving away from the cleaned substrates as the gates 51 and 52 are opened and closed to transport CRTs 44 from one chamber to the next, thus maintaining them in their cleaned condition. Further, because all chambers 40, 41 and 42 are at a positive pressure relative to atmospheric pressure, air flow through the gate valve 50 and through other leaks in the system will always out of the system, never into the system. Thus, the only air introduced into the system will be air introduced through the clean air inlet plenums 64, 65 and 66 and through the blast nozzle 14. Additionally air will move to some extent, as described above, from chamber to chamber.

In the preferred embodiment, the conveyor 48 can comprise any conveyor means known in the art for transporting the carriers 49 and supported CRTs 44 through the chambers 40, 41 and 42. Preferably, the conveyor 48 provides for controlled movement of each CRT 44 independent of other CRTs. This is commonly accomplished utilizing accumulation sections and separately controlled motors for various conveyor sections. The conveyor of the preferred embodiment comprises a plurality of rotating rollers.

The forward portion of the cleaning chamber 41 defined by the wall 63 houses the robot support base 61 and the robot 62 which carries the blast gun 39 and the nozzle 14 for delivering carbon dioxide blasting pellets to the substrate to be cleaned. The robot 62 is capable of moving the nozzle 14 so that it reaches all points of the surface to be cleaned and is further capable of moving the nozzle 14 in a specified pattern over the front face of the substrate 15 and of positioning the nozzle 14 at a selected angle to the substrate during movement of the nozzle. The specific design and construction of a robot 62 for accomplishing desired movements of the nozzle 14 is available to those skilled in the art.

Figure 4:
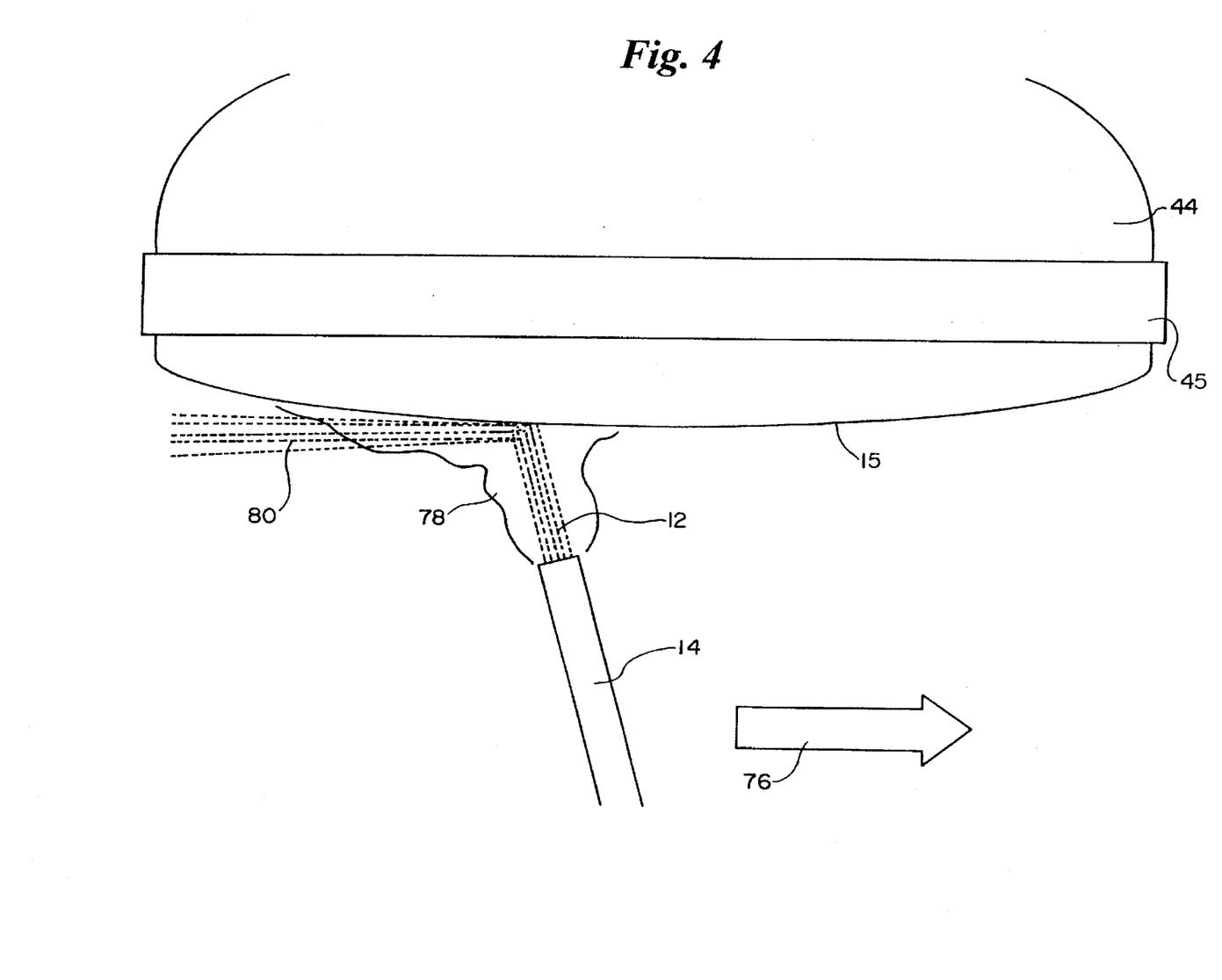
FIG. 4 is an enlarged plan view of a portion of a CRT showing details of the cleaning operation including the movement of carbon dioxide pellets and heated air from the dispensing nozzle and into engagement with the substrate.

FIG. 4 is an enlarged view of a CRT 44 showing the nozzle 14 in the process of cleaning the front surface of the substrate 15. In order to effectively clean the substrate 15 in preparation for thin film coating, the exit end of the nozzle 14 must be positioned and moved relative to the substrate surface 15 in a manner sufficient to accomplish such cleaning. A variety of factors will, of course, affect the ability of the carbon dioxide particles to effectively clean the particular substrate in question. These factors include the blast air pressure and temperature, the carbon dioxide pellet feed rate, the angle between the discharge nozzle 14 and the substrate 15, the speed at which the nozzle 14 traverses the surface 15, the distance between the nozzle exit and the substrate 15 and the number of passes over the substrate 15 among others. In the preferred embodiment and method, for cleaning the screen of a CRT, the blast air pressure in the line 37 (FIG. 1) preferably ranges from about 40 to 100 psig and the temperature of such blast air as controlled by the heater 36 ranges from about 100° to 250° C. Further, the optimum values for the above factors will vary to some extent, depending on the particular substrate and the material from which it is made. Preferably the carbon dioxide pellet feed rate through the line 38 (FIG. 1) and out through the nozzle 14 ranges from about 3 to 6 pounds per minute.

Although some cleaning of the substrate 15 will occur regardless of the impingement angle of the pellets 12 against the surface 15, it is preferable for the nozzle 14 to be positioned at an angle other than 90° relative to the front face of the substrate 15. In particular, it is preferable for the nozzle 14 to be tilted in the direction in which the nozzle 14 traverses across the substrate 15 and at an angle of about 5° to 45° relative to the substrate 15. In FIG. 4, the nozzle 14 is shown as being tipped in the direction of the directional arrow 76 representing the preferred direction of movement of the nozzle 14. During cleaning, pelletized carbon dioxide 12 is propelled from the exit end of the nozzle 14 toward the substrate 15 by the heated blast air 78. As the blast air 78 and pellets 12 strike the substrate surface 15, the pellets dislodge contaminants and other impurities from the surface 15 both as a result of impingement of the pellets against the surface 15 as well as by the vaporization, and thus expansion, of the carbon dioxide pellets from a solid into a gas. The carbon dioxide gas and pellets, together with the blast air 78, deflect from the surface 15 as illustrated by the reference character 80.

Any impingement of carbon dioxide particles onto the substrate 15, regardless of angle of the nozzle 14 or the direction of traverse will cause a localized chilling of the substrate surface 15. However, when the nozzle is tilted in the direction of traverse 76 as shown in FIG. 4, the heated blast air 78 in the blast stream transfers some of the heat to the substrate 15. This helps to limit condensation. Also, because the blast air 78 is quite dry, condensation is further limited. Accordingly, the nozzle 14 is preferably tilted in the direction of traverse 76 at an angle of about 5° to 45° relative to the substrate 15. Acceptable cleaning can, however, also be obtained with the nozzle 14 tilted away from the direction of traverse or at 90°, however, at these angles, undesirable condensation is more likely to occur.

Preferably, for the CRT screen of the preferred embodiment, the exit end of the nozzle 14 is positioned about 1.5 to 4 inches (4 to 10 cm) from the substrate surface 15 and traverses the surface at a speed of about 2 to 10 inches per second (5°–25° cm per second). The traverse pattern of the nozzle 14 involves a movement back and forth across the substrate with each pass being at a different vertical position until the entire substrate has been cleaned.

Having described the structure of the present invention in detail, the operation and method is described as follows. Upon start up, the chambers 40, 41 and 42 are empty. However, each of these chambers is maintained at controlled clean room and pressure conditions by virtue of clean air being introduced through the clean air inlet plenums 64, 65 and 66 (FIG. 3) and being exhausted through the vacuum pickups 54, 55 and 56 and the exhaust plenums 69, 68 and 70. Additionally, air is also exhausted from the chambers 40, 41 and 42 through the gate valves 50, 51 and 52, when opened and through other openings and/or leaks in the system.

The operation of the apparatus includes opening the gate valve 50 and introducing a carrier 49 with a mounted CRT 44 into the chamber 40. During movement of the carrier 49 into the chamber 40, some of the air within the chamber 40 will flow through the gate valve 50. However, because the air within the chamber 40 is at a positive pressure relative to the ambient atmosphere, the flow of air is out through the gate valve 50, not in. When the carrier 49 is fully within the chamber 40, the gate valve 50 is closed and the gate valve 51 is opened. The carrier 49 is then transported through the gate valve 51 into the cleaning chamber 41. During this movement, some air from the chamber 41 will flow through the gate valve 51 into the chamber 40 because of the pressure differential between the chamber 41 and the chamber 40. When fully inside the chamber 41, the gate valve 51 is closed. The robot 62 and cleaning apparatus can then be activated to clean the surface of the CRT 44. During this cleaning step, a second CRT 44 can be introduced into the entry chamber 40 in the manner described above. Although the preferred embodiment and method shows the CRT within the chamber 41 being stationary during cleaning, it could be moving. In such case, the robot 62 would compensate for such movement. When the cleaning of the CRT 44 in the chamber 41 is completed, the gate valve 52 is opened and the carrier 49 with a cleaned CRT 44 is moved from chamber 41 into the chamber 42. During this movement, some air within the chamber 42 will flow through the gate valve 52 into the chamber 41 because of the pressure differential between the chambers 42 and 41. When the cleaned CRT 44 is fully within the chamber 42, the gate valve 52 is closed. The valve 51 can then be opened to allow entry of a second CRT. The entire process is then repeated continuously.

When a cleaned CRT 44 is ready for coating, the gate valve 77 can be opened to allow the cleaned CRT to moved into the entry chamber of the coating apparatus 83 (FIG. 2). The coating apparatus can include any thin film coating apparatus available in the art. Preferably, however, the coating apparatus is an apparatus of the type described in pending application Ser. No. 08/142,638 filed Oct. 25, 1993, the substance of which is incorporated herein by reference.

Although the description of the preferred embodiment and method have been quite specific, it is contemplated that various modifications can be made without deviating from the spirit of the present invention. Accordingly, it is intended that the scope of the present invention be dictated by the appended claims rather than by the description of the preferred embodiment.

We claim:

1. A method of cleaning a substrate in preparation for thin film coating comprising the steps of:

providing a cleaning chamber having air inlet means and air exhaust means and introducing air into said cleaning chamber through said air inlet means and exhausting air form said cleaning chamber through said air exhaust means for maintaining air pressure and flow within said cleaning chamber at desired levels, wherein said cleaning chamber includes a substrate entry and a substrate exit maintaining air pressure within said cleaning chamber at a positive pressure relative to atmospheric pressure;

providing an entry chamber adjacent to said substrate entry in which said entry chamber includes an air inlet means and air exhaust means for maintaining air pressure and flow within said entry chamber at desired levels;

transporting a substrate to be cleaned to a cleaning position within said cleaning chamber; and exposing said substrate to a blast of carbon dioxide pellets suspended in and transported by a compressed gas medium, said blast of carbon dioxide pellets being effective to clean said substrate in preparation for thin film coating.

2. The method of claim 1 including maintaining air pressure within said entry chamber at a positive pressure relative to atmospheric pressure and maintaining air pressure within said cleaning chamber at a positive pressure relative to said entry chamber.

3. The method of claim 1 including providing an exit chamber adjacent to said substrate exit in which said exit chamber includes air inlet means and air exhaust means for maintaining air pressure and flow within said exit chamber at desired levels.

4. The method of claim 3 including maintaining air pressure within said entry chamber at a positive pressure relative to atmospheric pressure, maintaining air pressure within said cleaning chamber at a positive pressure relative to said entry chamber and maintaining air pressure within said exit chamber at a positive pressure relative to said cleaning chamber.

5. The method of claim 4 including providing closure means between said entry and cleaning chambers and between said cleaning and exit chambers for selectively isolating said entry, cleaning and exit chambers from one another and facilitating the transport of substrates from said entry chamber to said cleaning chamber and from said cleaning chamber to said exit chamber.

6. A method of cleaning a substrate in preparation for thin film coating comprising the steps of:

provided a cleaning chamber having air inlet means and air exhaust means for maintaining air pressure and flow within said cleaning chamber at desired levels, wherein said cleaning chamber includes a substrate entry and a substrate exit;

providing an air exit chamber adjacent to said substrate exit in which said exit chamber includes an air inlet means and air exhaust means for maintaining air pressure and flow within said exit chamber at desired levels;

transporting a substrate to be cleaned to a cleaning position within said cleaning chamber;

exposing said substrate to a blast of carbon dioxide pellets suspended in and transported by a compressed gas medium, said blast of carbon dioxide pellets being effective to clean said substrate in preparation for thin film coating; and maintaining air pressure within said cleaning chamber at a positive pressure relative to atmospheric pressure.

7. The method of claim 6 including maintaining air pressure within said exit chamber at a positive pressure relative to atmospheric pressure and relative to said cleaning chamber.

8. A method of cleaning a substrate in preparation for thin film coating comprising the steps of:

providing a cleaning chamber having air inlet means and air exhaust means wherein said air inlet means is a clean air inlet and is provided near the top of said cleaning chamber and introducing air into said cleaning chamber through said air inlet means and exhausting air from said cleaning chamber through said air exhaust means for maintaining air pressure and flow within said cleaning chamber at desired levels;

transporting a substrate to be cleaned to a cleaning position within said cleaning chamber; and exposing said substrate to a blast carbon dioxide pellets suspended in and transported by a compressed gas medium, said blast of carbon dioxide pellets being effective to clean said substrate in preparation for thin film coating.

9. The method of claim 8 wherein said air exhaust includes an ionizing vacuum pickup.

10. The method of claim 9 wherein said air exhaust further includes air exhaust plenum provided near the bottom of said cleaning chamber.

11. An apparatus for cleaning a substrate in preparation for thin film coating comprising:

a cleaning chamber having a substrate entry and a substrate exit; transport means for transporting said substrate through said substrate entry and into said cleaning chamber and for transporting said substrate out of said cleaning chamber through said substrate exit;

air inlet means and air exhaust means for maintaining air pressure and flow within said cleaning chamber at desired levels, wherein said air inlet means includes a clean air inlet near the top of said cleaning chamber and wherein said air exhaust means includes an ionizing vacuum pickup; and carbon dioxide particle dispensing means for dispensing carbon dioxide pellets into cleaning engagement with said substrate within said cleaning chamber.

12. The apparatus of claim 11 wherein said air exhaust means includes an exhaust plenum near the bottom of said cleaning chamber.

13. An apparatus for cleaning a substrate in preparation for thin film coating comprising:

a cleaning chamber having a substrate entry and a substrate exit, said substrate exit including a substrate exit separate from said substrate entry and an entry chamber adjacent to said substrate entry;

transport means for transporting said substrate through said substrate entry and into said cleaning chamber and for transporting said substrate out of said cleaning chamber through said substrate exit;

air inlet means and air exhaust means for maintaining air pressure and flow within said cleaning chamber at desired levels; and carbon dioxide particle dispensing means for dispensing carbon dioxide pellets into cleaning engagement with said substrate within said cleaning chamber.

14. The apparatus of claim 13 including closure means between said cleaning and entry chambers facilitating the transport of said substrate from said entry chamber into said cleaning chamber.

15. The apparatus of claim 14 including an exit chamber adjacent to said substrate exit.

16. The apparatus of claim 13 including entry chamber air inlet means and air exhaust means for maintaining air pressure and air flow within said entry chamber at desired levels.

17. An apparatus for cleaning a substrate in preparation for thin film coating comprising:

a cleaning chamber having a substrate entry and a substrate exit, said substrate exit including a substrate exit separate from said substrate entry and an exit chamber adjacent to said substrate exit;

transport means for transporting said substrate through said substrate entry and into said cleaning chamber and for transporting said substrate out of said cleaning chamber through said substrate exit;

air inlet means and air exhaust means for maintaining air pressure and flow within said cleaning chamber at desired levels; and carbon dioxide particle dispensing means for dispensing carbon dioxide pellets into cleaning engagement with said substrate within said cleaning chamber.

18. The apparatus of claim 17 including closure means between said cleaning and exit chambers facilitating the transport of said substrate from said cleaning chamber into said exit chamber.

19. The apparatus of claim 17 including exit chamber air inlet means and air exhaust means for maintaining air pressure and air flow within said exit chamber at desired levels.

20. The apparatus of claim 17 including a thin film coating line adjacent to said exit chamber.

21. The apparatus of claim 20 including a closure means between said exit chamber and said coating line facilitating the transport of said substrate from said exit chamber into said coating line.

22. An apparatus for cleaning a substrate in preparation for thin film coating comprising:

a cleaning chamber having a substrate entry and a substrate exit separate from said substrate entry;

transport means for transporting said substrate through said substrate entry and into said cleaning chamber and for transporting said substrate out of said cleaning chamber through said substrate exit;

air inlet means and air exhaust means for maintaining air pressure and flow within said cleaning chamber at desired levels; and carbon dioxide particles dispensing means for dispensing carbon dioxide pellets into cleaning engagement with said substrate within said cleaning chamber.

* * * * *